United States Patent [19]
Duttweiler et al.

[11] 3,945,002
[45] Mar. 16, 1976

[54] BLOCK DIGITAL PROCESSOR FOR USE WITH NONUNIFORMLY ENCODED DIGITAL WORDS

[75] Inventors: Donald Lars Duttweiler, Colts Neck; David Gavin Messerschmitt, Matawan, both of N.J.

[73] Assignee: Bell Telephone Laboratories, Incorporated, Murray Hill, N.J.

[22] Filed: Oct. 25, 1974

[21] Appl. No.: 517,879

[52] U.S. Cl................... 340/347 DD; 179/15 AV
[51] Int. Cl.²........................................ H03K 13/22
[58] Field of Search.......... 340/347 DD; 179/15 AV

[56] References Cited
UNITED STATES PATENTS

| | | | |
|---|---|---|---|
| 3,789,392 | 1/1974 | Candiani | 340/347 DD |
| 3,798,635 | 3/1974 | Candiani | 340/347 DD |

OTHER PUBLICATIONS

Croll et al., "Nearly Instantaneous Digital Compandor," Electronics Letters, Vol. 9, No. 14, 7/1973, pp. 298–300.
Croisier, "Progress In PCM and Delta Modulation: Block Companded," International Zurich Seminar on Digital communications 3/1974, 4 pages.

*Primary Examiner*—Thomas J. Sloyan
*Attorney, Agent, or Firm*—Daniel D. Dubosky

[57] ABSTRACT

A digital processor apparatus is described which operates upon nonuniformly encoded digital words each one of which has $\mu$-law encoded format of a sign bit to indicate polarity, segment bits to indicate range, and interval bits to indicate the location of the sample within the segment. A predetermined number of the digital words is stored in shift registers while the apparatus determines the maximum segment value represented in that block of predetermined number of words. The interval bits for one of the stored digital words are stored in a shift register along with a bit whose value is determined from the segment bits for that word. This shift register is then shifted by an amount which is dependent on the difference between the segment value for the digital word under consideration and the maximum segment value for that block of digital words. Before the next digital word is processed, the processed digital word in the shift register which has fewer bits than the original digital word is coupled into a digital multiplexer for transmission to a receiving location. The processed digital words are preceded in the transmission by the maximum segment value for the block of digital words. At the receiver, the maximum segment value is utilized by a receiving processor to reconstruct each of the processed digital words into a digital word compatible with the nonuniform encoding law from which the input samples were drawn.

11 Claims, 4 Drawing Figures

FIG. 3

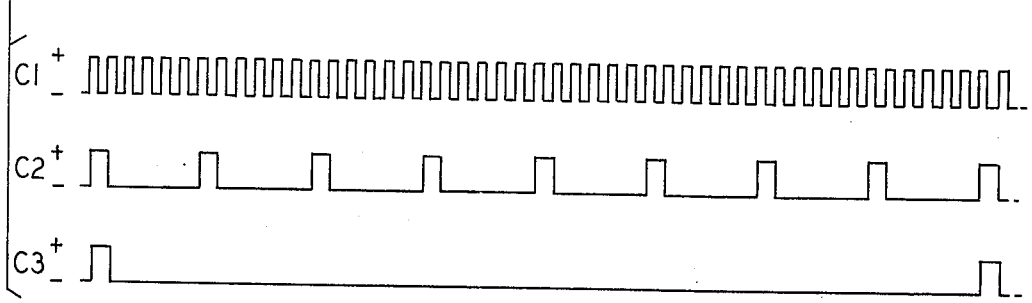

FIG. 4

8-TO-6-TO-8 BIT CODE TRANSLATION TABLE

| MAXIMUM SEGMENT | INPUT 8-BIT WORD | 6-BIT CODE | RECONSTRUCTED 8-BIT WORD |
|---|---|---|---|
| 111 | S111WXYZ | S1WXYZ | S111WXYZ |
| 111 | S110WXYZ | S01WXY | S110WXY1 |
| 111 | S101WXYZ | S001WX | S101WX10 |
| 111 | S100WXYZ | S0001W | S100W100 |
| 111 | S011WXYZ | S00001 | S0111000 |
| 111 | S010WXYZ | S00000 | S0100000 |
| 111 | S001WXYZ | S00000 | S0100000 |
| 111 | S000WXYZ | S00000 | S0100000 |
| 110 | S110WXYZ | S1WXYZ | S110WXYZ |
| 110 | S101WXYZ | S01WXY | S101WXY1 |
| 110 | S100WXYZ | S001WX | S100WX10 |
| 110 | S011WXYZ | S0001W | S011W100 |
| 110 | S010WXYZ | S00001 | S0101000 |
| 110 | S001WXYZ | S00000 | S0010000 |
| 110 | S000WXYZ | S00000 | S0010000 |
| 101 | S101WXYZ | S1WXYZ | S101WXYZ |
| 101 | S100WXYZ | S01WXY | S100WXY1 |
| 101 | S011WXYZ | S001WX | S011WX10 |
| 101 | S010WXYZ | S0001W | S010W100 |
| 101 | S001WXYZ | S00001 | S0011000 |
| 101 | S000WXYZ | S00000 | S0001000 |
| 100 | S100WXYZ | S1WXYZ | S100WXYZ |
| 100 | S011WXYZ | S01WXY | S011WXY1 |
| 100 | S010WXYZ | S001WX | S010WX10 |
| 100 | S001WXYZ | S0001W | S001W100 |
| 100 | S000WXYZ | S0000W | S000W100 |
| 011 | S011WXYZ | S1WXYZ | S011WXYZ |
| 011 | S010WXYZ | S01WXY | S010WXY1 |
| 011 | S001WXYZ | S001WX | S001WX10 |
| 011 | S000WXYZ | S000WX | S000WX10 |
| 010 | S010WXYZ | S1WXYZ | S010WXYZ |
| 010 | S001WXYZ | S01WXY | S001WXY1 |
| 010 | S000WXYZ | S00WXY | S000WXY1 |
| 001 | S001WXYZ | S1WXYZ | S001WXYZ |
| 001 | S000WXYZ | S0WXYZ | S000WXYZ |
| 000 | S000WXYZ | S0WXYZ | S000WXYZ |

BLOCK DIGITAL PROCESSOR FOR USE WITH NONUNIFORMLY ENCODED DIGITAL WORDS

BACKGROUND OF THE INVENTION

This invention relates to bit rate reduction and expansion and, more particularly, to methods and apparatus for processing nonuniformly encoded digital words.

Many digital compressors have been developed in the prior art for use with uniformly encoded analog signals. The digital compressor disclosed in U.S. Pat. No. 3,789,392 to G. Candiani, dated Jan. 29, 1974, is representative of these digital compressors of the prior art. In these compressors a uniformly encoded digital word is reduced in size prior to tranmission by translating the number of digital zeros which follow the initial sign bit into a 3-bit code word. The 3-bit code word is then followed with a predetermined number of bits which follow the initial digital zeros. In the case of large magnitude digital words many of the less significant digital bits are simply discarded.

The digital format developed in the Candiani patent is similar to the format developed by encoders in the D2 and D3 channel banks of the Bell System, utilized to convert analog signals into a nonuniformly encoded digital bit stream. These channel banks in their process of encoding analog signals nonuniformly quantize these signals in order to improve the signal-to-noise ratio of the low level signals at the expense of a coarse quantization of the high amplitude analog signals. The nonuniform encoding utilized by the channel banks in the Bell System is known to those skilled in the art as $\mu$-law encoding. In the $\mu = 255$ nonuniform law utilized in the D2 and D3 channel banks of the Bell System, each analog sample is converted into an 8-bit binary code. The initial bit of the digital word represents the sign or polarity of the analog sample while the coarse amplitude of the analog sample is represented by the three bits following the sign bit, each value of this 3-bit word representing one of eight amplitude ranges known as segments or chords. The length of these segments double in magnitude as the signal becomes larger in magnitude. Finally, the remaining four digital bits represent one of 16 equal-length intervals present in each one of the segments or chords.

Still another form of digital bit rate reduction for use with uniformly encoded analog samples is known to those skilled in the art as nearly instantaneous digital companding or as block companding. This technique of nearly instantaneous companding is described in the article by M. G. Croll, M. E. B. Moffat and D. W. Osborne entitled "'Nearly Instantaneous' Digital Compandor for Transmitting Six Sound-Programme Signals in a 2.048 Mbit/s Multiplex," *Electronics Letters*, July 12, 1973, Vol. 9, No. 14, pages 298–300, and in the article entitled "Progress in PCM and Delta Modulation: Block-Companded Coding of Speech Signals," by A. Croisier, IBM France Center d'Etudes et Recherches, 06610 - La Gaude, France, from a presentation at the 1974 International Zurich Seminar on Digital Communications, March 12–15, 1974.

In the technique of nearly instantaneous companding the uniformly encoded samples are processed in blocks of a predetermined number of samples. The predetermined number of encoded samples in each block is stored in a digital delay while the largest sample for the block is determined. The value of this largest sample is then utilized to process the digital words stored in the delay. The position of the most significant "1" in the largest sample is represented by a scale factor word and this word is then multiplexed along with the processed digital words in transmitting information to a receiving location.

In the nearly instantaneous compandor described in the article by M. G. Croll et al., the peak value in a block of digital words is determined by searching for the most significant digital 1 in the block of digital words. The position for this most significant digital 1 is then utilized by the processor in determining the most significant bit of a fixed length word to be transmitted for each of the digital words in the block. The block processing described in the A. Croisier article carries out a similar technique of bit rate reduction with an additional feature for determining the maximum of the differences between successive samples if differential pulse code modulation coding is considered. In both forms of prior art block processors, uniformly encoded analog samples are present at the input of the apparatus.

SUMMARY OF THE INVENTION

It is a primary object of the present invention to reduce the number of digital bits which must be transmitted to represent nonuniformly encoded digital words of the type present at the output of the D2 and D3 channel banks in the Bell System.

A further object of the present invention is to process these digital words with a technique similar to that utilized in the above-mentioned prior art nearly instantaneous or block compandors.

These objects and others are achieved in accordance with the present invention wherein a block of a predetermined number of nonuniformly encoded words is stored in a digital delay while a maximum segment or chord value present in that block is determined and stored for use in processing each of the digital words in the block. The least significant or interval bits for each stored digital word are placed in a shift register along with a bit whose value is determined by the corresponding segment bits for that digital word. The register is then shifted by an amount which is dependent on the difference between the stored maximum segment value and the segment value represented by the segment bits to develop a processed digital word. The maximum segment value is then multiplexed with the processed digital words of the block for transmission to another processor in a receiving location. At the receiving location, the maximum segment value developed after demultiplexing is then utilized in reconstructing digital words having the same number of digital bits and the same encoding format as those which were presented at the input of the transmitter digital processor.

BRIEF DESCRIPTION OF THE DRAWINGS

The invention will be more thoroughly understood after reading the following detailed description in conjunction with the drawings wherein:

FIG. 3 provides voltage waveforms developed by clock timing circuits in the transmitting and receiving processors of FIGS. 1 and 2, respectively; and FIG. 4 is a table of digital values useful in explaining the operation of the present invention.

DETAILED DESCRIPTION

Figure 1:
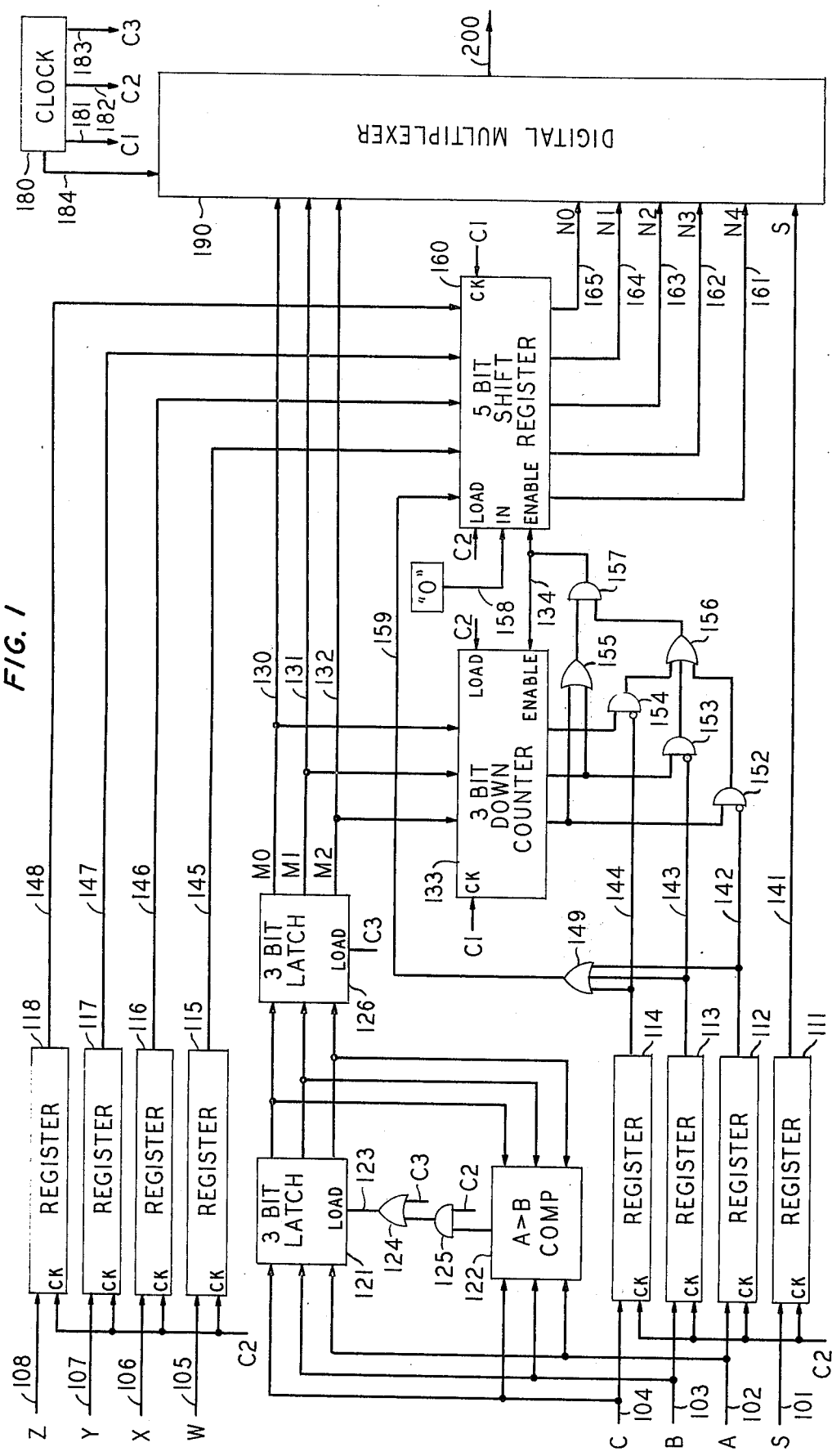
FIG. 1 is a schematic block diagram of a transmitter digital processor constructed in accordance with the present invention.

The technique utilized in the present invention for reducing the bit rate required for the transmission of nonuniformly encoded digital words is illustrated in FIG. 4 of the drawings. FIG. 4 shows a table of digital values useful in explaining the operation of the present embodiment wherein an 8-bit digital word previously encoded in accordance with a $\mu$-law encoding is translated into a 6-bit digital word for transmission to a receiving location. In the embodiment to be described, eight digital words are present in each block of digital words processed by the processor. As indicated in the second column of FIG. 4, each digital word at the input of the transmitting processor includes a signal bit as the initial bit followed by three bits which designate the segment or chord of the encoding to which the sample belongs, followed by four digital bits to represent one of the 16 intervals into which each segment or chord is divided. With three bits available to represent the segment, eight segment values are possible.

In FIG. 4 only the segment or chord values are represented by their proper digital values. The sign bit is represented by the letter S and the four bits corresponding to the interval within the segment or chord are represented by the letters WXYZ. It is to be understood that these letters may assume a binary representation of any one of 16 digital values corresponding to the sixteen intervals present in a segment or chord. The encoding for any particular 8-bit digital word is dependent on the value of the maximum segment within the block of digital words. To determine the processed digital code for any 8-bit digital word presented at the input of the processor, one must first know the maximum segment within the block of digital words and then locate the row in FIG. 4 for that maximum segment value which also includes the segment value indicated by the three bits of the 8-bit digital word following the sign bit. The third column of FIG. 4 illustrates the 6-bit digital code produced in response to the digital word set forth in the second column. Finally, the fourth column of FIG. 4 illustrates the 8-bit digital word which is reconstructed at a receiving location after the 6-bit digital word of column three has been transmitted over a transmission channel together with the maximum segment bits.

If the digital word being processed has a segment value equal to the maximum segment value within a block of digital words, the three bits representing the segment value are simply replaced by a digital 1 (except when the segment of the input digital word is 000) and the WXYZ bits representing the interval are transmitted without alteration. For any digital word having a segment value less than the maximum segment value within the block of digital words, the digital 1 is shifted to the right by a number of digit spaces determined by the difference between the two segment values. (If the segment of the input digital word is 000, a digital 0 takes the place of the digital 1.) The digit spaces between the sign bit and the digital 1 are filled with digital 0s, and the WXYZ bits are dropped from consideration, starting with the least significant digital bit, by a number equal to the number of inserted digital 0s. In the highly unlikely situation where there is both a maximum segment value equal to one of the higher levels and samples corresponding to the lower segment values within the same block of digital words, the lower segment words all bear the same digital representations. In effect, the present technique of processing previously nonuniformly encoded words causes the digital words within each block of digital words to be quantized into a format wherein the quantization steps are uniformly spaced and are determined by, and equal to, the intervals in the maximum segment. An exception is on segment 000 where the step size is one-half as large.

Apparatus constructed in accordance with the present invention to practice the novel method of bit rate reduction illustrated in FIG. 4 is set forth in schematic block diagram form in FIG. 1 of the drawings. In FIG. 1, each input 8-bit digital word is presented in parallel form on the input lines 101 through 108. The sign bit represented by the letter S is presented on line 101; the three digital bits corresponding to the segment value are represented in FIG. 1 by the letters A, B and C and are presented on input lines 102, 103 and 104, respectively. The letter A represents the most significant digital bit and C represents the least significant bit of the segment value. Finally, the four digital bits representing one of 16 intervals within the corresponding segment are represented by the letters W, X, Y and Z, and presented in parallel form on input lines 105, 106, 107 and 108, respectively.

All of the apparatus shown in FIG. 1 is driven by a clock circuit 180 which provides at its various outputs rectangular voltage waveforms of the type illustrated in FIG. 3. An essentially square waveform is provided on line 181 at the output of clock circuit 180 and is designated in both FIGS. 1 and 3 as C1. Within clock circuit 180, waveform C1 is counted down by six to provide the rectangular waveform on line 182 of the type illustrated in FIG. 3 as waveform C2. The positive-going excursions of waveform C2 are caused to occur at a rate equal to the rate at which 8-bit digital words are presented in parallel form on the input lines 101 through 108. In addition, clock circuit 180 further counts down the waveform C2 by eight in order to provide a rectangular waveform on line 183 of the type illustrated as waveform C3 in FIG. 3. Positive-going excursions in waveform C3 occur at the block rate with each block containing eight digital words.

The digital bits present on input lines 101 through 108 are each connected to an input terminal of one of a group of shift registers 111 through 118, respectively. Line 182 provides the C2 clock pulse waveform to the shift inputs of the registers 111 through 118. As a result, each positive-going transition in waveform C2 causes the digital bits present on input lines 101 through 108 to be coupled into the cells of shift register 111 through 118, respectively. Shift registers 112 through 118 are constructed to have nine cells each, thereby permitting the storage within the register of an entire block of eight input words plus one word in the output cells which is acted on by the circuits to be described hereinafter. Shift register 111, which stores the sign bits, has an additional cell (i.e., a total of 10 cells) to account for a delay introduced into the other bits by the remainder of the processing circuits.

The digital bits A, B and C representing the segment value of a digital word are also coupled by way of lines 102, 103 and 104 to the inputs of a 3-bit latch circuit 121 and a comparison circuit 122. The 3-bit latch circuit 121 is caused to load the three bits present on lines 102, 103 and 104 only if an energizing pulse is present at its control input 123. Control input 123 is energized only when either one of the inputs of an OR gate 124 is energized. One of the inputs of OR gate 124 is connected to the C3 waveform on line 183 from clock circuit 180. As a result, the A, B, C bits for the first digital word in a block of digital words is caused to be loaded into the 3-bit latch circuit 121. A second input of OR gate 124 is energized by the output of an AND gate 125 which in turn can be energized by the presence of a pulse in the C2 waveform, but only if the A, B, C bits present on input lines 102, 103 and 104 represent a magnitude greater than the digital bits presently being stored within the 3-bit latch circuit 121. Hence, if the A, B, C bits of the second digital word in a block of eight digital words represents a segment value larger than the segment value of the first digital word, comparison circuit 122 energizes one input of AND gate 125 and the presence of a pulse in the C2 waveform causes this larger segment value to be loaded into the 3-bit latch circuit 121. If, on the other hand, the segment value for a digital word on lines 102, 103 and 104 is less than the three bits stored within the 3-bit latch circuit 121, comparison circuit 122 does not produce an energizing signal at one input of AND gate 125 and the positive-going pulse in the C2 waveform will be ineffective in its efforts to load the input of the 3-bit latch circuit 121.

In this way comparison circuit 122, AND gate 125 and OR gate 124 operate in response to the C2 and C3 waveforms in a manner so as to cause the maximum segment value within a block of digital words to be selected and stored in the 3-bit latch circuit 121. At the beginning of a new block of digital words marked by the presence of a positive-going pulse in the C3 waveform, this positive-going pulse on line 183 energizes the load input of a second 3-bit latch circuit 126 whose inputs are connected to the outputs of 3-bit latch circuit circuit 121. As a result, the maximum segment value stored in 3-bit latch circuit 121 is transferred into storage within the 3-bit latch circuit 126 at the same instant when the first digital word of the block corresponding to that maximum segment value is present at the outputs of shift registers 111 through 118.

The three bits stored within 3-bit latch circuit 126 representing the maximum segment value for the block of digital words appearing at the outputs of shift registers 111 through 118 are designated as the M2, M1 and M0 bits on lines 130, 131 and 132 of FIG. 1, with M2 representing the most significant bit. These bits are coupled by way of lines 130, 131 and 132 both to the inputs of a 3-bit down counter 133 and to the inputs of a digital multiplexer circuit 190.

The C2 waveform present on line 182 is coupled to the load input of 3-bit down counter 133. When a positive pulse of the C2 waveform is present at the load input, a positive-going transition in waveform C1 on line 181 at the clock input of 3-bit down counter 133 causes the digital bits present on lines 130, 131 and 132 to be loaded into the 3-bit down counter 133. As pointed out hereinabove, waveform C2 is derived within the clock circuit 180 by counting down waveform C1. Due to the small amount of delay present in these divider circuits, transitions in the C2 waveform will always follow in time the positive-going transition in the C1 waveform. As a result, the positive-going transition in the C1 waveform which terminates the positive pulse of the C2 waveform will actually occur during an instant when the C2 waveform is providing a positive level to the load input of 3-bit down counter 133. Hence, five of the six positive-going transitions in waveform C1 are present during the interval between positive pulses in the C2 waveform.

With the appearance of each positive transition in the C2 waveform, a new digital word appears at the outputs of shift registers 112 through 118 on lines 141 through 148, respectively. The sign bit at the output of shift register 111 is coupled by way of line 141 to an input of the digital multiplexer 190 to be processed in a manner described hereinafter. The segment bits present on lines 142, 143 and 144 are each coupled both to an input of an OR gate 149 and to an inhibit input of one of the AND gates 152, 153 and 154. The digital bits present at the outputs of shift registers 115 through 118 representing the interval are coupled by way of lines 145 through 148, respectively, to the last four cells in a 5-bit shift register 160 with the Z bit on line 148 being positioned in the last cell.

The first or leading cell of the 5-bit shift register 160 is connected by way of line 159 to receive the logical state developed at the output of OR gate 149. If a digital 1 is present in any one or more of the outputs of shift registers 112, 113 and 114, OR gate 149 will present a logical 1 to the input of the first cell in the 5-bit shift register 160. If, on the other hand, the three bits present on lines 142, 143 and 144 are all logical 0s, then OR gate 149 presents a logical 0 to the input of the first cell of shift register 160. With a positive pulse of the C2 waveform present at the load input of shift register 160, a positive-going transition in waveform C1 at the clock input of this shift register causes the digital values present on lines 159, 145, 146, 147 and 148 to be loaded into the cells of the 5-bit shift register 160.

An AND gate 157 has its output connected by way of line 134 both to the enable input of 3-bit down counter 133 and also to the enable input of 5-bit shift register 160. As indicated hereinabove, the clock pulses of waveform C1 are connected to the clock inputs of the down counter and the shift register. If AND gate 157 is energized at its two inputs, thereby energizing both enable inputs, each positive-going transition in waveform C1 causes 3-bit down counter 133 to reduce its digital value by one and also causes each digital bit present in shift register 160 to be shifted by one cell to the right. The load input of both the down counter and the shift register overrides the corresponding enable input, and therefore the down counting and shifting only take place when the load inputs are not energized by the positive pulses of the C2 waveform. As the digital word in shift register 160 is shifted by one cell to the right, a logical 0 present on line 158 at an input of shift register 160 is coupled into the first cell of the register. Briefly, the positive-going transitions in waveform C1 are caused to shift the digital bits present in shift register 160 by an amount which is dependent on the difference between the maximum segment value initially stored in 3-bit down counter 133 and the segment value presented by the digital word to be processed on lines 142, 143 and 144.

One input of AND gate 157 is coupled to the output of an OR gate 155 which in turn has inputs coupled to the two most significant bits present in down counter 133. The second input of AND gate 157 is connected to the output of an OR gate 156 which in turn has its inputs connected to the outputs of gates 152, 153 and 154. As pointed out hereinabove, the inhibit inputs of each of the AND gates 152, 153 and 154 are connected to receive the segment bits on lines 142, 143 and 144, respectively. The second inputs of these AND gates 152, 153 and 154 are connected to the output bits of down counter 133, each gate being connected to an output of counter 133 which corresponds to the same bit position presented to the gate at its inhibit input by one of the lines 142, 143 and 144. With this connection of AND gates 152, 153 and 154 an energizing signal is provided to one of the inputs of OR gate 156 as long as the digital word present in down counter 133 is greater than the digital word presented at the outputs of shift registers 112, 113 and 114. When these two words are identical no energizing signal is presented to OR gate 156 and, therefore, AND gate 157 is inhibited from energizing the enable input of shift register 160. OR gate 155, on the other hand, terminates its energizing signal to AND gate 157 when either a 001 or a 000 is present in down counter 133. In summary, the positive-going transitions in the C1 waveform are caused to shift the digital word loaded into shift register 150 until either the segment value present on lines 142, 143 and 144 equals the digital value developed by down counter 133 or until a digital 1 is no longer present in the two most significant bit positions present at the output of 3-bit down counter 133. In this way, the three bits representing the segment value in an 8-bit digital word are replaced by the logical 1 and logical 0 formats illustrated in column three of FIG. 4 and the WXYZ digital bits representing the interval are dropped in sufficient number to accommodate the additional zeros which must be added.

The digital word present in the cells of shift register 160 is presented to the digital multiplexer 190 by way of lines 161 through 165. Each of these digital words is, of course, accompanied by a sign bit on line 141 which is unaltered by the transmitter processing. The sign bit present on line 141 corresponds to the digital bits present on lines 161–165 even though the processing by the down counter and the register has consumed a C2 period since the sign bit is delayed by an additional cell in shift register 111.

Digital multiplexer 190 also receives a square-wave clock pulse waveform from clock circuit 180 by way of line 184. Digital multiplexer 190 utilizes the clock pulses on line 184 to derive the digital bit rate utilized in transmitting over the transmission channel 200. In addition, waveforms equivalent to the C2 and C3 waveforms are derived within digital multiplexer 190, in a manner well known to those skilled in the multiplexing art, in order to determine when the maximum segment bits present on lines 130, 131 and 132 and the digital bits present on lines 141 and 161 through 165 must be sampled. The maximum segment bits are coupled by digital multiplexer 190 to transmission channel 200 after a framing or synchronization code word is transmitted to indicate that a new block of samples has begun. These maximum segment bits are then followed by the processed digital words in the digital block of samples represented by the digital values present on lines 141 and 161 through 165.

Figure 2:
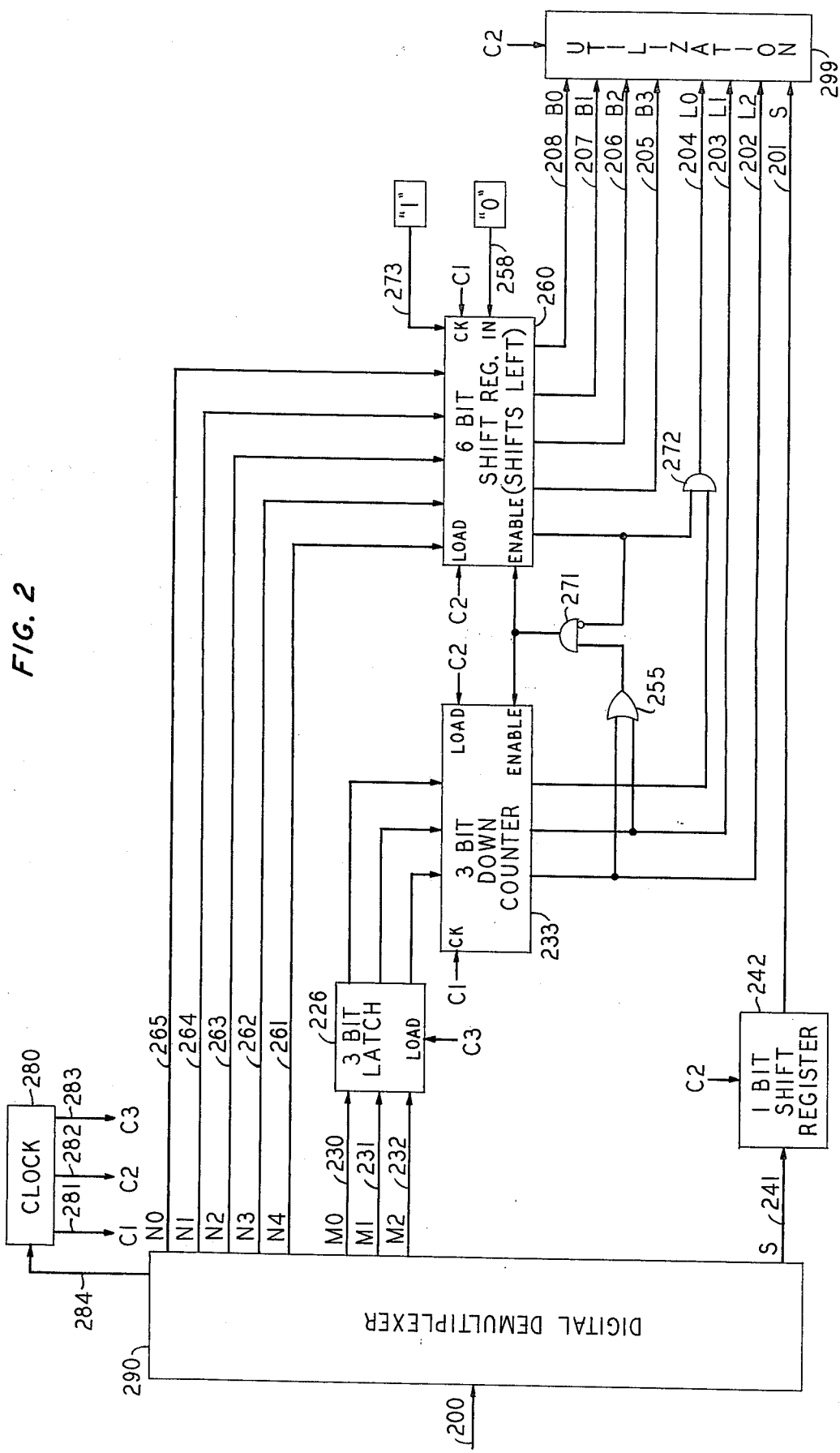
FIG. 2 is a schematic block diagram of a receiver digital processor constructed in accordance with the present invention.

After the processed digital words are transmitted over transmission channel 200, they are demultiplexed at a receiving location by the digital demultiplexer 290 in FIG. 2. The maximum segment digital bits M2, M1 and M0 corresponding to those digital bits which were stored in the 3-bit latch circuit 126 are provided at the beginning of each block on lines 232, 231 and 230, respectively, in FIG. 2 by the digital demultiplexer 290. The digital words which were generated by the transmitter processor during each block of digital words are provided seriatim in parallel bit form on lines 261 through 265 by demultiplexer 290. In addition, demultiplexer 290 drives a clock circuit 280 in response to the bit rate on transmission channel 200 so as to produce clock waveforms on lines 281, 282 and 283 which are equivalent to the C1, C2 and C3 waveforms, respectively, previously generated in the transmitter processor of FIG. 1. These waveforms developed by clock circuit 280 in FIG. 2 are also illustrated by the voltage waveforms in FIG. 3.

At the beginning of each block of processed digital words, the positive-going transition in waveform C3 energizes the loading input of a 3-bit latch circuit 226 thereby causing the maximum segment word on lines 230, 231 and 232 to be loaded into this latch circuit. The bits of the processed digital word are coupled by way of lines 261 through 265 to the first five cells of a 6-bit shift register 260. The sixth cell of shift register 260 is provided with a voltage equivalent to a logical 1 by way of line 273. When the positive pulse of waveform C2 is present at the enable input of shift register 260, a positive-going transition in waveform C1 connected to the clock input of shift register 260 causes the processed digital word on lines 261–265 and the logical 1 on line 273 to be stored in the shift register. Similarly, the positive pulse in waveform C2 activates the load input of a 3-bit down counter 233 and a positive-going transition in waveform C1 connected to the clock input of this down counter causes the maximum segment word from 3-bit latch circuit 226 to be entered into the down counter 233.

An AND gate 271 has its output connected both to an enable input of 3-bit down counter 233 and to an enable input or 6-bit shift register 260. When AND gate 271 is energized and thereby providing an energizing signal to both enable inputs, each positive-going transition in the C1 waveform at the clock input of down counter 233 causes the digital word stored in this counter to be reduced in value by one, and each positive-point transition of the C1 waveform at the clock input of shift register 260 causes the digital bits stored in that shift register to be shifted to the left by one cell position. As the digital bits are shifted to the left, the last cell on the right is provided with a digital 0 by way of line 258. As in the case of the transmitting processor of FIG. 1, the load inputs of counter 233 and shift register 260 override the corresponding enable inputs and therefore the down-counting and shifting action only take place when the load inputs are not energized.

One input of AND gate 271 is connected to the output of an OR gate 255 whose two inputs are connected to the two most significant bit positions of the 3-bit down counter 233. In addition, an inhibit input of AND gate 271 is connected to the first or leftmost cell of 6-bit shift register 260. There are five positive-going transitions in waveform C1 of line 281 that occur between the positive pulses of waveform C2 on line 282. As indicated hereinabove, these five positive-going transitions of waveform C1 are only effective in operating down counter 233 and shift register 260 if AND gate 271 is energized. AND gate 271 in turn is energized only if a logical 1 is present in either one or both of the two most significant bit positions of counter 233 and if a logical 0 is present in the first or leftmost cell of register 260 and will remain energized until a digital 0 is present in both of the two most significant digital bits of down counter 233 or until a digital 1 is present in the first or leftmost cell of shift register 260. In cases where the maximum segment value of the block is large and the segment value of the word being processed is small, all five positive-going transitions in the C1 waveform may be coupled through to the shift input of register 260.

As indicated in the table of digital values in FIG. 4, the first cell of shift register 260 may contain either a digital 1 or a digital 0 when the shifting has been terminated by the development of 001 in down counter 233 or after a total of five shifts has been produced by the five positive-going transitions in waveform C1. The output of this first cell in shift register 260 is connected to one input of an AND gate 272, a second input of which is connected to receive the least significant bit present in down counter 233. At the moment when the positive pulse of waveform C2 is present, these two inputs of AND gate 272 combine to provide on line 204 the least significant bit of the reconstructed segment word illustrated in column four of FIG. 4. The most significant bit and the next most significant bit of the reconstructed segment word are provided at this instant on lines 202 and 203 from the two most significant bit positions of 3-bit down counter 233. At the same instant, that is, during the positive pulses of waveform C2, the second through fifth cells of 6-bit shift register 260 provide a reconstructed digital word to represent the interval as indicated in column four of FIG. 4.

The sign bit presented on line 241 by demultiplexer 290 is coupled into a one-bit shift register 242 by the positive-going transition in the C2 waveform. The delay of one C2 period introduced by this shift register balances the equivalent one period delay imparted to the other bits of a processed word by the operation of counter 233 and shift register 260. The sign bit on line 201 from register 242, the reconstructed segment word, and the reconstructed interval word are presented to utilization apparatus 299 which responds to the positive pulses in waveform C2 to sample these digital words and store them for further utilization or transmission.

What has been described hereinbefore is an illustrative embodiment of the present invention. It is to be understood that numerous departures therefrom may be made by those skilled in the art without departing from the spirit and scope of the present invention. For example, input digital words that have been developed by other nonuniform encodings such as A-law encoding are equally well suited for processing by the present invention. In addition, the processed words developed by the transmitting processor do not have to be multiplexed in a serial form but may also be transmitted in parallel bit form to the receiving processor.

We claim:

1. Apparatus for processing previously encoded digital words each one of which includes segment bits to indicate a location in an encoding range and interval bits to indicate a location within a segment, said apparatus comprising means for storing said segment bits and said interval bits for a predetermined number of input digital words, said predetermined number being greater than one, means responsive to said segment bits for determining a maximum segment value present in said predetermined number of input digital words, means for processing the stored segment bits and interval bits for each of said input digital words to develop a processed digital word with fewer digital bits in response to a difference between the value of said stored segment bits and said maximum segment value determined for said predetermined number of input digital words, and means for transmitting a predetermined number of processed digital words with said maximum segment value corresponding to said predetermined number of processed digital words.

2. Apparatus as defined in claim 1 wherein said means for processing the stored segment bits and interval bits includes a shift register means having cells equal in number to at least one more than the number of interval bits in each of said input digital words, means responsive to the stored segment bits for entering a digital value into at least one cell of said shift register means, and means for coupling the stored interval bits into other cells of said shift register means.

3. Apparatus as defined in claim 2 wherein said means for entering a digital value into at least one cell of said shift register means includes an OR gate having a plurality of inputs each one of which is connected to receive a different one of said stored segment bits.

4. Apparatus as defined in claim 2 wherein said means for processing the stored segment bits and interval bits includes means for selectively enabling said shift register means.

5. Apparatus as defined in claim 4 wherein said means for processing the stored segment bits and interval bits further includes a down counter means responsive to said maximum segment value for an initial setting of said down counter means, said down counter means having an enable input which is responsive to means for selectively enabling said shift register means.

6. Apparatus as defined in claim 5 wherein said means for selectively enabling said shift register means includes a plurality of AND gates each one of which has one input terminal connected to receive a different output from said down counter means and a second input terminal connected to receive a corresponding bit of said stored segment bits, an OR gate for combining the outputs of said plurality of AND gates, a second OR gate for combining selected outputs of said down counter means, and a single AND gate for combining the outputs of said first and second OR gates.

7. A machine method of further encoding previously encoded digital words derived from a segmented nonuniform encoding to reduce the number of bits which must be transmitted, each word having a sign bit, segment bits to identify an amplitude range in said encoding, and interval bits to identify an amplitude position in said range, comprising the steps of delaying a predetermined number of said digital words, said predetermined number being greater than one, determining the segment bits corresponding to the maximum range represented by said segment bits in said predetermined number of digital words, storing the segment bits determined to correspond to the maximum range, processing each one of the delayed digital words in response to a difference between its segment bits and said stored segment bits corresponding to the maximum range to develop a reduced digital word for each delayed digital word, and transmitting said stored segment bits corresponding to the maximum range with the reduced digital words developed from the digital words in said predetermined number.

8. A machine method of further encoding previously encoded digital words as defined in claim 7 wherein the step of processing each one of the delayed digital words includes replacing the segment bits in said each one of the delayed digital words by a single bit of a type selected from the segment bits, and inserting a selected number of bits of a predetermined type in digit spaces preceding said single bit, the number being dependent on said difference between its segment bits and said stored segment bits corresponding to the maximum range.

9. Apparatus for reconstructing a block of previously encoded digital words each one of which is associated with a sign bit and a maximum segment corresponding to the block of digital words, said apparatus comprising a shift register means having a plurality of cells for storing one digital word from said block of previously encoded digital words, down counter means having a plurality of bit positions representing a count, means for initially setting said down counter means in response to said maximum segment prior to processing said one digital word, means for decreasing the count in said down counter means and for shifting said one digital word stored in said shift register means toward an end cell of said shift register means providing a predetermined logical state is present in either one of at least two cells of said down counter means and providing a second predetermined logical state is present in the end cell of said shift register means, means responsive to the digital values present in said down counter means and to those present in the cells of said shift register means for developing a reconstructed digital word, and means for coupling said reconstructed digital word and the sign bit associated with said one digital word to an output terminal.

10. Apparatus for reconstructing a block of previously encoded digital words as defined in claim 9 wherein said means for decreasing the count in said down counter means and for shifting said one digital word in said shift register means includes an AND gate having at least two input terminals, an OR gate having at least two inputs each one of which is connected to a different one of the bit positions in said down counter means, means for connecting the output of said OR gate to one of said at least two input terminals of said AND gate, and means for connecting a second one of said at least two input terminals of said AND gate to the end cell of said shift register means.

11. Apparatus for reconstructing a block of previously encoded digital words as defined in claim 10 wherein said means responsive to the digital values present in said down counter means and to those present in the cells of said shift register means includes a second AND gate, one input of which is connected to the least significant bit position of said down counter means and a second input of which is connected to the end cell of said shift register means.

* * * * *